United States Patent
Bedeschi

(10) Patent No.: US 10,185,622 B2
(45) Date of Patent: Jan. 22, 2019

(54) MEMORY DEVICE HAVING ADDRESS AND COMMAND SELECTABLE CAPABILITIES

(71) Applicant: MICRON TECHNOLOGY, INC., Boise, ID (US)

(72) Inventor: Ferdinando Bedeschi, Biassono (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/494,213

(22) Filed: Apr. 21, 2017

(65) Prior Publication Data

US 2017/0220411 A1 Aug. 3, 2017

Related U.S. Application Data

(63) Continuation of application No. 14/617,784, filed on Feb. 9, 2015, now Pat. No. 9,672,101, which is a continuation of application No. 13/512,000, filed as application No. PCT/IT2009/000582 on Dec. 29, 2009, now Pat. No. 8,954,821.

(51) Int. Cl.
| | |
|---|---|
| *G06F 11/10* | (2006.01) |
| *G11C 29/42* | (2006.01) |
| *G06F 12/02* | (2006.01) |
| *G11C 8/12* | (2006.01) |
| *G06F 3/06* | (2006.01) |

(52) U.S. Cl.
CPC ........ *G06F 11/1016* (2013.01); *G06F 3/0604* (2013.01); *G06F 3/0644* (2013.01); *G06F 3/0673* (2013.01); *G06F 11/1068* (2013.01); *G06F 12/0223* (2013.01); *G11C 8/12* (2013.01); *G11C 29/42* (2013.01)

(58) Field of Classification Search
CPC .. G06F 11/1016; G06F 3/0604; G06F 3/0644; G06F 3/0673; G06F 11/1068; G06F 12/0223; G11C 29/42; G11C 8/12
USPC ................................ 714/763, 768, 773, 799
See application file for complete search history.

(56) References Cited

U.S. PATENT DOCUMENTS

| | | | |
|---|---|---|---|
| 5,465,260 A | 11/1995 | Zook | |
| 5,875,477 A | 2/1999 | Hasbun et al. | |
| 6,493,260 B2 | 12/2002 | Micheloni et al. | |
| 7,350,044 B2 * | 3/2008 | Keays | G06F 11/1068 365/185.29 |
| 7,469,368 B2 | 12/2008 | Chen et al. | |
| 7,739,576 B2 * | 6/2010 | Radke | G06F 11/1068 711/103 |
| 7,810,017 B2 * | 10/2010 | Radke | H03M 13/05 714/758 |
| 7,984,360 B2 | 7/2011 | Sharon et al. | |
| 8,065,467 B2 | 11/2011 | Micheloni et al. | |
| 8,375,257 B2 | 2/2013 | Hong et al. | |
| 9,672,101 B2 * | 6/2017 | Bedeschi | G06F 12/0223 |
| 2007/0124647 A1 * | 5/2007 | Chen | G06F 11/1068 714/763 |

(Continued)

OTHER PUBLICATIONS

ISA/EPO, International Search Report and Written Opinion of the International Searching Authority, Int'l Appl. No. PCT/IT2009/000582, Jun. 18, 2010, European Patent Office, Rijswijk, NL. 9 pgs.

*Primary Examiner* — John J Tabone, Jr.
(74) *Attorney, Agent, or Firm* — Holland & Hart LLP

(57) ABSTRACT

Subject matter disclosed herein relates to memory management, and more particularly to partitioning a memory based on memory attributes.

17 Claims, 4 Drawing Sheets

(56) References Cited

U.S. PATENT DOCUMENTS

| | | | |
|---|---|---|---|
| 2009/0055713 A1* | 2/2009 | Hong | G06F 11/10 |
| | | | 714/763 |
| 2013/0007564 A1* | 1/2013 | Bedeschi | G06F 12/0223 |
| | | | 714/763 |
| 2014/0101519 A1* | 4/2014 | Lee | G06F 11/1068 |
| | | | 714/773 |
| 2014/0136927 A1* | 5/2014 | Li | G06F 11/1048 |
| | | | 714/768 |
| 2015/0154068 A1* | 6/2015 | Bedeschi | G06F 12/0223 |
| | | | 714/768 |
| 2017/0220411 A1* | 8/2017 | Bedeschi | G06F 11/1004 |

* cited by examiner

MEMORY DEVICE HAVING ADDRESS AND COMMAND SELECTABLE CAPABILITIES

REFERENCE TO RELATED APPLICATIONS

This application is a continuation of U.S. patent application Ser. No. 14/617,784 by Bedeschi, entitled "Memory Device Having Address and Command Selectable Capabilities," filed Feb. 9, 2015, now U.S. Pat. No. 9,762,101, issued Jun. 6, 2017, which is a continuation of U.S. patent application Ser. No. 13/512,000 by Bedeschi, entitled "Memory Device Having Address and Command Selectable Capabilities," filed Sep. 21, 2012, now U.S. Pat. No. 8,954,821, issued Feb. 10, 2015, which is a national stage entry of International Patent Application No. PCT/IT2009/000582 by Bedeschi, entitled "Memory Devices Comprising Partitions with Particular ECC Attributes," filed Dec. 29, 2009, assigned to the assignee hereof, and each of which is expressly incorporated by reference in its entirety herein.

BACKGROUND

Subject matter disclosed herein relates to memory management, and more particularly to partitioning a memory based on memory attributes. Information: Memory devices are employed in many types of electronic devices, such as computers, cell phones, PDA's, data loggers, and navigational equipment, just to name a few examples. Among such electronic devices, various types of memory devices may be employed, such as NAND and NOR flash, SRAM, DRAM, and phase-change memory, just to name a few examples. In general, writing or programming processes may be used to store information in such memory devices, while a read process may be used to retrieve stored information. Stored information may be erased from all or a portion of a memory device, while new information may be subsequently written into erased portions of the memory device. Such program-erase cycles may degrade the physical integrity of a memory device. For example, thousands of program-erase cycles imposed on a flash memory device may reduce a reliability of the memory device. Information stored on a memory device may include several general types, such as operating system code, software application code and data, secure information, and other relatively important and/or sensitive information. Such information may be stored in memory for relatively long periods of time so that relatively few program-erase cycles may be imposed on such memory. On the other hand, a memory device may store less important information such as multimedia content, or data that is not part of an application and/or operating system, for example. Such information may be stored in memory for relatively short periods of time so that relatively many program-erase cycles may be imposed on such memory. Accordingly, a reliability of memory storing information may be affected by the particular type of information stored, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
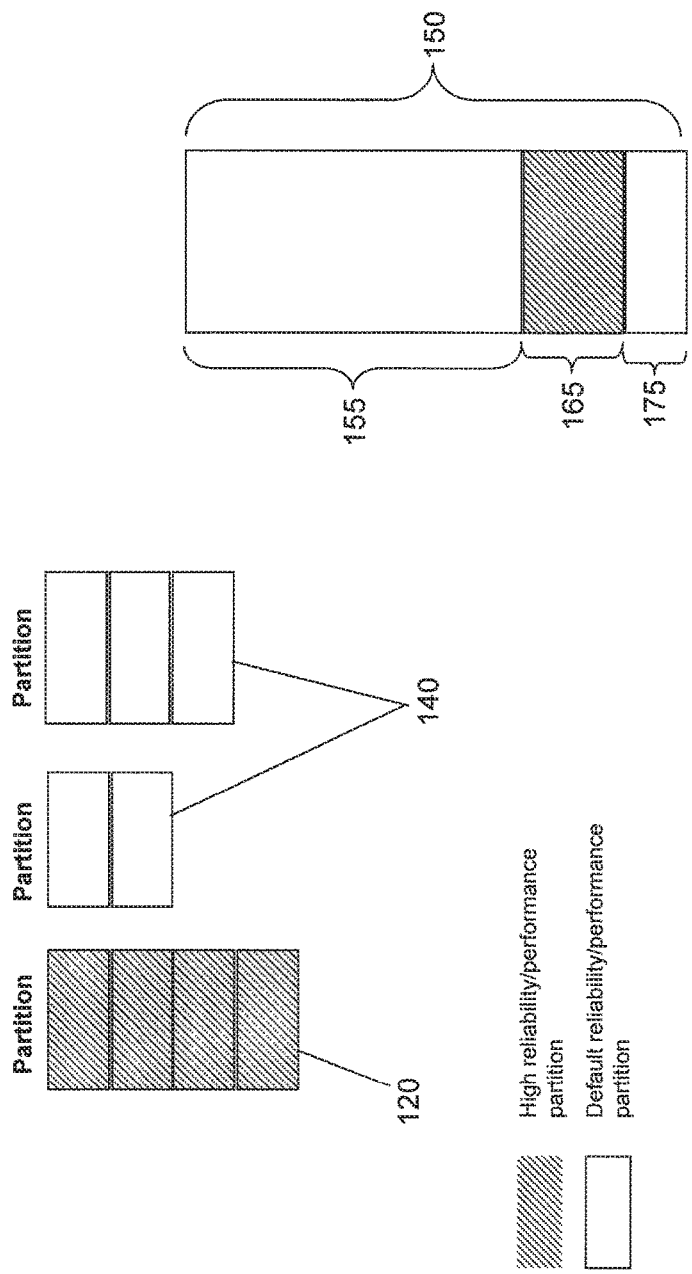
FIG. 1 is a schematic view of a memory partition configuration, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory array may be partitioned into two or more partitions that may be associated with different independent and/or configurable address spaces. Such partitions may be accessible by dedicated commands, such as read and/or write commands that include a memory address specifying a memory location in a partition, for example. Such a memory array may comprise phase change memory (PCM), NAND or NOR flash memory, SRAM, DRAM, or other type of memory, and claimed subject matter is not limited in this respect. A partition of a memory array may be characterized by a particular attribute. Such an attribute may be associated with a reliability and/or program speed of a particular memory partition, for example. In an embodiment, a particular memory partition of a memory array may correspond to a relatively high reliability and/or a relatively low program speed as well as relatively high read performance, while another particular memory partition of the memory array may correspond to a relatively low reliability and/or a relatively high program speed as well as a moderate read performance. Such reliability and/or program or read speed may be related to, for example, type of applied error correcting code (ECC) algorithm, attributes of set or reset pulses used to program a particular memory partition, and/or attributes of sense amplifier circuits used to read/verify a particular programmed memory partition.

Particular techniques of writing to such partitions may differ, based, at least in part, on the type of information to be written, as discussed in more detail below. Memory partitions may include, or be associated with, dedicated sense amplifier circuits to read bit distributions stored in respective partitions. In case of relatively high speed performance, one sense amplifier may retrieve information by comparing a cell current or voltage under given biasing conditions against a single reference. In case of more sophisticated techniques, which may be useful if an available signal is particularly small, such as in the case of relatively fast programming, a process of analog to digital conversion may be used, for example. In such a case, a cell current or voltage may be compared with a plurality of references so that a relatively complex biasing algorithm may be utilized. For example, in response to a given conversion step and/or to a pattern of read data, an over-biasing or an under-biasing may be utilized. Further, signal processing and/or communication techniques may be applied in order to minimize a probability of having a read error. Memory partitions may also include, or be associated with, ECC and/or parity management, for example. In this case, for a relatively highly reliable partition, wherein a bit error rate (BER) may be low, correcting techniques like the Hamming code or the BCH may be applied, for example. An amount of parity bits used and/or ECC space may be relatively small. If reliability is reduced, more sophisticated correcting techniques such as convolutional codes, soft decoding, and/or leveraging on minimum error probability paths like the Viterbi algorithm may be used, just to name a few examples. A relatively fine-grained sensing based on analog to digital conversion and/or a proper decoding state machine may be used. In such a case, read speed may be degraded but write performance may benefit. Here, the amount of parity bits utilized may be higher than in the case described above, since the BER before correction is relatively high in the present case, for example.

In a particular embodiment, a processor may partition a memory array into two or more partitions having such associated attributes. In another particular embodiment, a memory array may be partitioned into such partitions during manufacture of the memory array. A host or host system may interact with a memory controller inside a memory system, for example, to partition a memory array associated with such a memory system.

A host may initiate read/write commands associated with information to be read or written to a partitioned memory array and/or associated with a memory address of the partitioned memory array. In one implementation, a location, or partition, of a partitioned memory array in which information is to be stored may be determined based, at least in part, on the type of information to be stored. For example, a type of information may comprise program code, operating system code, and/or data. For example, a memory device may determine to store relatively important information in a memory partition of the memory array associated with relatively slow write speed but a relatively high degree of reliability and/or relatively high read performance. Such relatively important information may include processor operating system code, for example. In another implementation, a location, or partition, of a partitioned memory array to where information is to be stored may be based, at least in part, on an address and/or command generated by a host and/or memory controller. For example, a host may determine to store relatively unimportant information, such as multimedia data, in a memory partition of the memory device associated with relatively fast write speed but with a relatively low degree of reliability. Accordingly, in one implementation, a rate at which to write information into a memory array may be selected based at least in part on an address and/or command associated with the information. Of course other information types may be considered, of which a few will be discussed below. Accordingly, claimed subject matter is not limited to any such examples described herein.

FIG. 1 is a schematic view of a memory partition configuration, according to an embodiment. A memory device, such as a PCM device for example, may include a user-addressable memory space 150 comprising one or more portions having different attributes. In one implementation, memory space 150 may or may not be contiguous, and may or may not reside on a single device. Memory space 150 may comprise portions 165, 155, and 175 corresponding to an attribute, as discussed above. In one particular implementation, such an attribute may comprise type of sense amplifier, type of ECC, type of programming algorithm and/or write circuits, and so on. Here, portion 165 may correspond to a relatively highly reliable memory portion as a result of applying an extensive write algorithm to portion 165, for example. In contrast, portions 155 and 175 may correspond to a lower reliability, perhaps as a result of not applying an extensive and relatively fine-grained program algorithm, without a verify algorithm, for example. Accordingly, a memory space may be configured to include main user memory 150 and two or more partitions such as partitions 120 and 140. Such configuring may include defining partitions corresponding to levels or degrees of a particular attribute, such as high reliability to store program code and low reliability to store user data, as in the example above. In other words, different partitions may be associated with different levels or degrees of attributes as well as being associated with different types of stored information in terms of desired reliability and use. Returning to the example above, partition 120 may be associated with a memory portion 165 that has a relatively high reliability and/or performance, whereas partitions 140 may be associated with memory portions 155 and 175 that have a relatively low reliability and/or performance. Individual partitions may comprise independent addressable spaces that may be accessed by read, write, and/or erase processes, for example. In a particular implementation, a host and/or memory device may impose one or more restrictions on the types of operations allowed on a particular partition. For example, a host may inhibit write and/or erase operations on a particular partition to prevent program code stored in such a partition from being externally altered. Of course, such features are merely examples, and claimed subject matter is not so limited.

In one embodiment, a host, such as a memory controller, may determine the number and/or sizes of partitions into which memory space 150 may be partitioned. Such a host may also select what attributes to employ in order to configure partitions of memory space 150. In addition to selecting such attributes, a host may also determine which levels or degrees of such attributes correspond to which particular partitions, for instance. In the examples above, such levels or degrees of attributes have been limited to high and low for the sake of simplicity, but the number of such levels or degrees is not limited to two, and claimed subject matter is also not so limited.

In an embodiment, a memory array may be partitioned into one or more partitions using a technique that involves selectively blowing fuses or programming dedicated cells fabricated with the memory array. As a result, selected portions of a memory array may be electrically connected or disconnected to other portions of memory circuitries so that partitions having desired attributes may be realized. In another embodiment, a memory array may be partitioned into two or more partitions by a user via a host processor and/or memory controller. For example, a memory controller, upon receiving instructions from a processor and/or user, may partition a memory array using switches, multiplexers, and so on in order to create two or more partitions having respective attributes. In one implementation, stored configuration data may define or describe two or more partitions in terms of addresses and/or ranges of addresses of a partitioned memory array. Such an array may be contained in one particular memory device or may span two or more memory devices. For example, a partition may comprise a single contiguous memory array within one device or may comprise a memory space that spans multiple devices, wherein boundaries of such a partition need not coincide with device boundaries. Configuration data may be stored in a nonvolatile memory, which may be external or internal to the memory array. For example, a portion of a memory array of the memory device may be reserved for maintaining such configuration data. Of course, such techniques for partitioning a memory array are merely examples, and claimed subject matter is not so limited.

In an embodiment, information to be stored in partitions may be characterized by one or more information types or attributes, as mentioned above. A memory device may determine the type of information to be stored based at least in part on a high-level name extension associated with a command, for example, corresponding to the information. To illustrate a particular embodiment, a controller in the memory device may recognize attributes, such as file name extensions, for example, related to the file type of which an external host processor is about to store, and determine a partition in which to store the file type. The controller may recognize such attributes as related to multimedia content, such as pictures, music, video, and so on. Accordingly, the controller may direct such information to a partition having lower performance in terms of reliability, though such a partition may have higher performance in terms of write speed. To illustrate another particular embodiment, a controller may recognize attributes, such as file name extensions, for example, of a file type as related to operating system code, program code, and so on. Accordingly, the controller may direct such information to a partition having higher performance in terms of reliability and read speed, though such a partition may have lower performance in terms of write speed. Of course, such techniques for selecting partitions in which to store various file types are merely examples, and claimed subject matter is not so limited.

Figure 2:
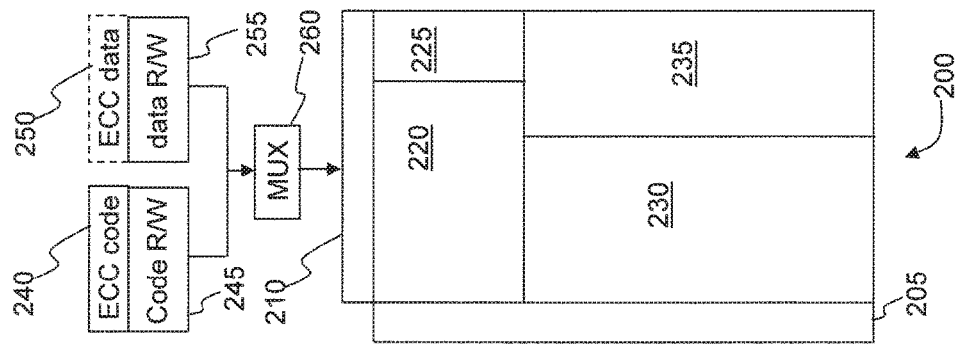

FIG. 2 is a schematic view of a memory partition configuration, according to an embodiment. A memory array 200 may be addressed using an row decoder 205 corresponding to word lines, for example, and a column decoder 210 corresponding to bit lines, though claimed subject matter is not limited in this respect. Information such as data and/or program code may be stored in memory array 200, which may be partitioned into two or more partitions. As used herein, data refers to relatively non-critical information such as multimedia content, photo files, music, video, and so on. In contrast, code refers to relatively non-critical information such as operating system code, program code, and so on. For example, integrity of operating system code may be critical to the operation of a computing device, whereas multimedia data such as a music file may be relatively non-critical. Of course, terms such as "critical" and "non-critical" are relative terms, and are merely intended to associate a general qualitative attribute to such information to be stored in memory.

In one implementation, a code partition 220 to store program code, for example, may occupy a particular range of rows, while a data partition 230 to store data, for example, may occupy another particular range of rows. Again, program code may refer to operating system code, software application code, and/or other information that may be considered to be relatively important to have a high degree of reliability, for example. Data, in contrast, may refer to less important information such as multimedia content, or data that is not part of an application and/or operating system, for example. A portion of memory array 200 may be associated with a particular memory partition. For example, memory portion 225 may contain ECC parity bits to apply to respective bits belonging to code partition 220. Such ECC code (e.g., BCH) may be relatively complex, extensive, and/or robust to have a relatively high capacity to correct bit errors included in information read from memory portion 220 and/or 225, which may have a relatively low BER due to a relatively complex program-verify process, for example. Although such a capacity to correct bit errors may be beneficial, such ECC code may result in relatively slow write processes. For example, write speed may be approximately a few megabytes per second. In contrast, however, memory portion 235 may contain ECC parity bits to apply to their respective bits belonging to data partition 230. Since an expected BER after relatively fast programming may be relatively high, the number of parity bits may be high as well. Also, an ECC code, herein called ECC data 250, may be relatively robust while allowing for relatively fast write processes. For example, write speed may be approximately tens of megabytes per second (e.g., 50 MB/s or more). In one particular implementation, data partition 230 and its parity bits 235 may be associated with an ECC code, herein called ECC data 250, which may be executed outside of the memory chip, e.g. in a controller chip stacked on a package that includes the memory chip, for example. Of course, such details of error correction processes are merely examples, and claimed subject matter is not so limited.

In one embodiment, a memory device may include an ECC code block 240 to maintain and/or provide ECC code to a code portion of memory array 220 and/or 225 (parity). Such ECC code may comprise one or more ECC algorithms and/or ECC parameters to be used for error-correcting the code stored in code partition 220.

Similarly, a memory device may include an ECC data block 250 to maintain and/or provide ECC code to a data portion of memory array 230 and/or 235 (parity). In one implementation, ECC data block 250 may be located external to the memory device that includes memory array 200, though claimed subject matter is not so limited. Sense amplifiers and/or write circuits (R/W) may be dedicated to code and data, having different characteristics. For instance, a relatively highly accurate write circuit may be used by code array 220 and 225 in order to implement a program and verify algorithm that relies on multiple pulses, analog program references, and so on. On the other hand, a relatively simple, smaller, and faster write circuit may be used to write data 230, 235. Relatively slow sensing circuitries may be used by data 230 in order to have a relatively fine (e.g., high resolution) analog to digital conversion. For example, thirty-two or sixty-four levels may be needed to have a sufficient level of quantization, which may involve hundreds of microseconds to milliseconds of read latency. Such a circuitry may not be used if reading code 220 and 225 since processor instructions may be executed in a relatively short time, such as less than 100 nanoseconds, for example. A multiplexer 260 may be used to select among code and data channels. Such a selection may be based, at least in part, on whether information to be processed comprises code or data, for example. Determining the type of information may involve comparing a memory address and/or a command associated with the information, for example. Of course, such details of memory partitions are merely examples, and claimed subject matter is not so limited.

Figure 3:
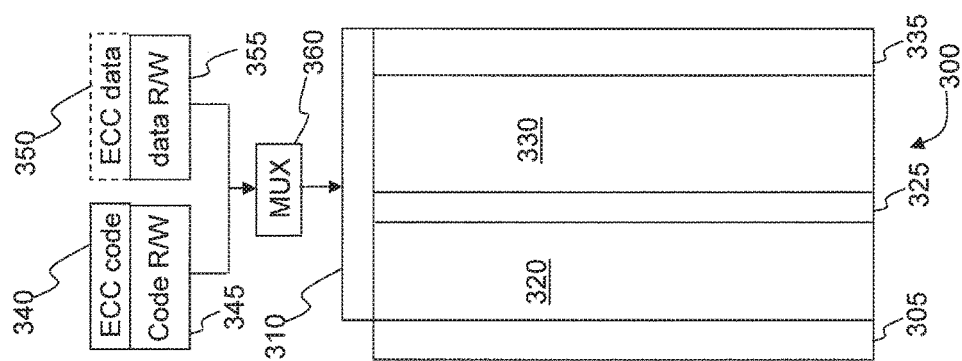

FIG. 3 is a schematic view of a memory partition configuration, according to another embodiment. A memory array 300 may be addressed using an row decoder 305 corresponding to word lines, for example, and a column decoder 310 corresponding to bit lines, though claimed subject matter is not limited in this respect. Information such as data and/or program code may be stored in memory array 300, which may be partitioned into two or more partitions. In one implementation, a code partition 320 to store program code, for example, may occupy a particular range of columns, while a data partition 330 to store data, for example, may occupy another particular range of columns. As explained above, program code refers to operating system code, software application code, and/or other information that may be considered to be relatively important to have a high degree of reliability. Data, in contrast, refers to less important information such as multimedia content, or data that is not part of an application and/or operating system, for example. A portion of memory array 300 may be associated with a particular memory partition. For example, memory portion 325 may contain ECC parity bits to apply to code partition 320. ECC hard code (e.g., BCH) may be relatively complex, extensive, and/or robust to have a relatively high capacity to correct bit errors included in information read from memory portion 320 and 325, which may have a relatively low BER due to a relatively complex program-verify process, for example. In contrast, however, memory portion 335 may contain ECC parity bits to apply to data partition 330. Since BER after fast programming may be high, the number of parity bits may also be high, and ECC code, herein called ECC data 350, may be relatively robust while allowing for relatively fast write-processes, for example.

In one embodiment, a memory device may include an ECC code block 340 to maintain and/or provide ECC code to a code portion of memory array 320 and 325. Such ECC code may comprise one or more ECC algorithms and/or ECC parameters to be used for error-correcting the code stored in code partition 320. Similarly, a memory device may include an ECC data block 350 to maintain and/or provide ECC code to a portion of the data of memory array 330 and 335. In one implementation, ECC data block 350 may be located external to the memory device that includes memory array 300, though claimed subject matter is not so limited. A multiplexer 360 may be used to select among code and data channels. Such a selection may be based, at least in part, on whether information to be processed comprises code or data, for example. Determining the type of information may involve comparing a memory address and/or a command associated with the information, for example.

Figure 4:
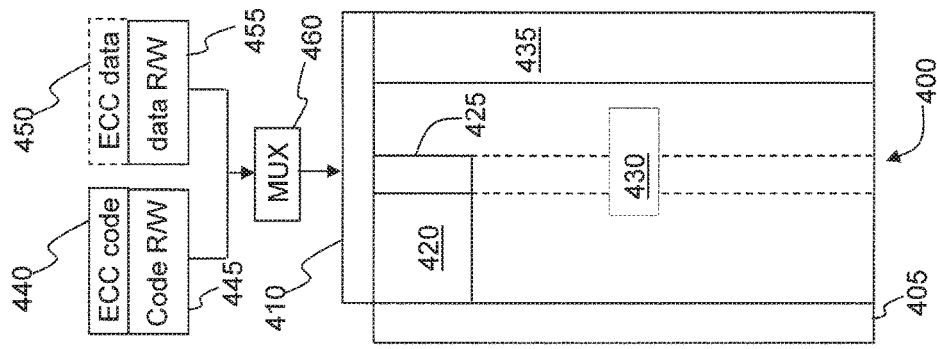
FIGS. 2-4 are schematic views of memory partition configurations, according to other embodiments.

FIG. 4 is a schematic view of a memory partition configuration, according to yet another embodiment. A memory array 400 may be addressed using a row decoder 405 corresponding to word lines, for example, and a column decoder 410 corresponding to bit lines, though claimed subject matter is not limited in this respect. Information such as data and/or program code may be stored in memory array 400, which may be partitioned into two or more partitions. In one implementation, a code partition 420 to store program code, for example, may occupy a particular range of rows and columns, while a data partition 430 to store data, for example, may occupy another particular range of rows and columns. A portion of memory array 400 may be associated with a particular memory partition. For example, memory portion 425 may contain ECC code to apply to code partition 420. The kind of ECC hard code (e.g., BCH) may be relatively complex, extensive, and/or robust to have a relatively high capacity to correct bit errors included in information read from memory portion 420 and 425, which may have a relatively low BER due to a complex program-verify process, for example. In one embodiment, a memory device may include an ECC code block 440 to maintain and/or provide ECC code to a portion of memory array 400, such as memory portion 420 and 425. Such ECC code may comprise one or more ECC algorithms and/or ECC parameters to be used for error-correcting code stored in code partition 420. Similarly, a memory device may include an ECC data block 450 to maintain and/or provide ECC code to a portion of the data memory array 430, 435. Both data 430 and their respective parity bits 435 may share word lines with code 420, having instead different bitlines. In such a case, a ratio between data 425 and the parity bits may differ from the corresponding ratio where the word line of the array 400 may not contain any code information. Such a difference may be managed by block 450 or an external controller that manages soft correction algorithms for the data part according to the address, for example. In an implementation, a portion of bitlines 435 need not be used, thus leading to the same or similar ratios or to any combination between data bits and parity bits required by correcting code, which may lead to similar or equal correcting capabilities, for example. In another implementation, ECC data block 450 may be located external to the memory device that includes memory array 400, though claimed subject matter is not so limited. A multiplexer 460 may be used to select among code and data channels. Such a selection may be based, at least in part, on whether information to be processed comprises code or data, for example. Determining the type of information may involve comparing a memory address and/or a command associated with the information, for example.

ECC code blocks 240, 340, 440 and ECC data blocks 250, 350, 450 may differ from characteristics described above if memory requirements differ as well, for example. In one implementation, a relatively high reliability may be utilized without a read speed constraint or with a relatively low constraint. In such a case, more sophisticated (and time consuming) correction algorithms may be executed by block 240, 340 and 440. For example, soft decoded algorithms (e.g., Viterbi, TCM), or by a proper concatenation of hard decoded (BCH) and/or soft decoded (Viterbi) algorithms. If a desired reliability of data is further lowered, a more simple correction or no correction may be implemented by blocks 250, 250, 450.

Figure 5:
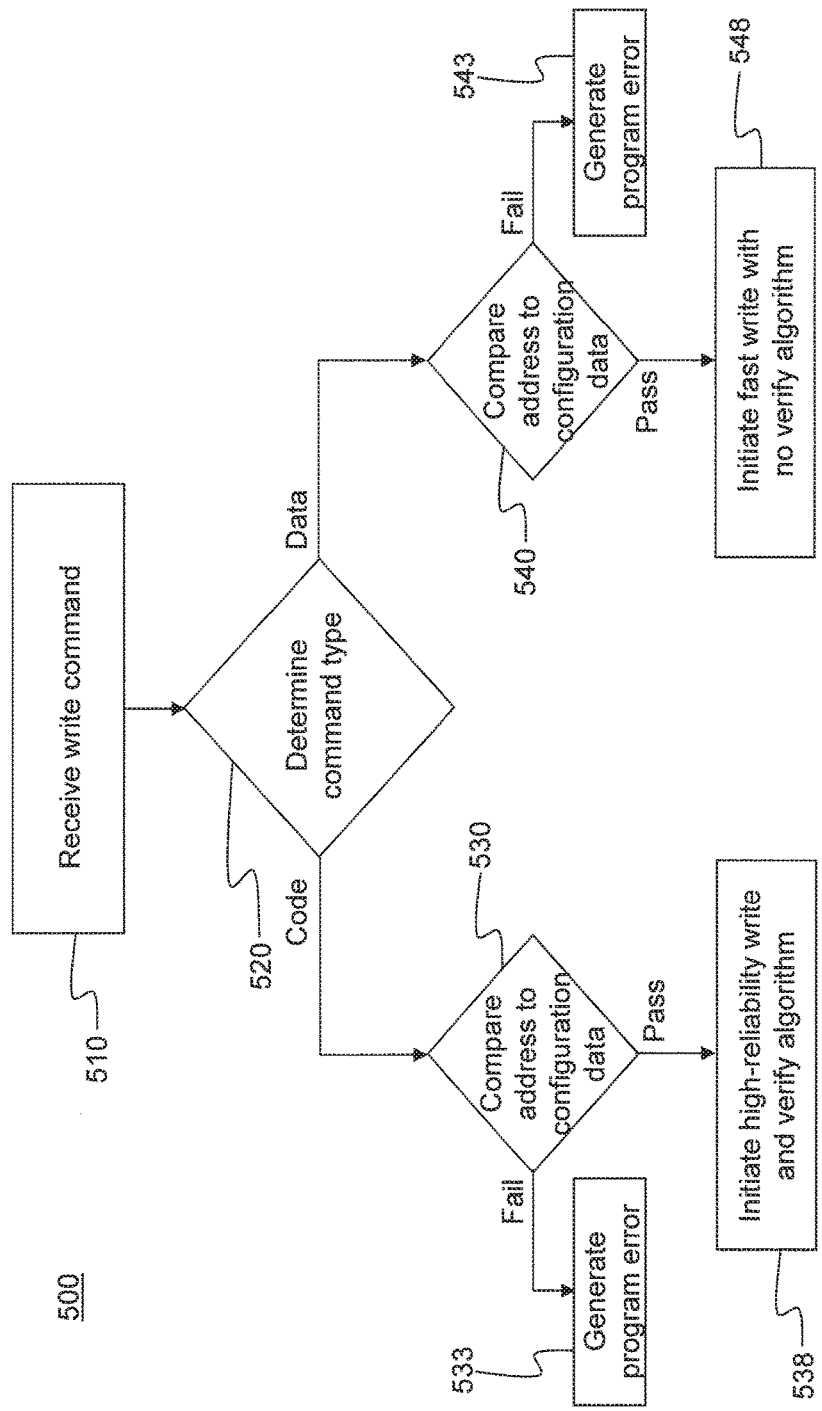
FIG. 5 is a flow diagram of a write process, according to an embodiment.

FIG. 5 is a flow diagram of a write process 500, according to an embodiment. At block 510, a memory device may receive a write command, which may include a memory address and information to be stored at such memory address. In one implementation, such a memory device may include an integrated controller. In another implementation, such a memory device may utilize a controller that is external to the memory device. In still another implementation, such a memory device may comprise multiple memory devices forming a memory array that utilizes a single controller, for example. At diamond 520, the memory device, using matching logic and/or comparison circuitry or any capability of an interpreter of the commands, for example, may determine whether information associated with the write command comprises code or data, as described above. In the case for code, process 500 may proceed to diamond 530, where the memory address received with the write command may be compared to configuration data. Such a comparison may be performed in order to confirm that received code information is to be written into a memory partition configured to store code with relatively high reliability. In one implementation, such configuration data may comprise one or more addresses or ranges of addresses stored in a nonvolatile memory, which may be external or internal to the memory device. For example, a portion of a memory array of the memory device may be reserved for maintaining such configuration data, as mentioned above. If such a comparison results in a match, then process 500 may proceed to block 538 where received code information may be written to a memory partition using one or more techniques resulting in highly reliable storage of the code information. For example, such code information may be written into a memory partition using a plurality of programming pulses, such as reset pulses having amplitudes that vary from one another, set pulses having relatively long pulse widths, particular set pulse peak height, and/or set pulse shape. Also, writing such code information may be associated hard coded ECC and/or relatively fast sense amp circuitry, for example. On the other hand, if such a comparison fails to result in a match, then process 500 may proceed to block 533 where the memory device may generate program error signals to be transmitted to a memory controller and/or host processor, for example.

Returning to diamond 520, if received information associated with a write command is determined to be data, then process 500 may proceed to diamond 540, where the memory address received with the write command may be compared to configuration data. Such a comparison may be performed in order to confirm that received data information is to be written into a memory partition configured to store data with relatively low reliability (but with one or more beneficial attributes such as higher write speed, for example). In one implementation, such configuration data may comprise one or more addresses or ranges of addresses stored in a nonvolatile memory, which may be external or internal to the memory device, as described above. For example, a portion of a memory array of the memory device may be reserved for maintaining such configuration data. If such a comparison results in a match, then process 500 may proceed to block 548 where received data information may be written to a memory partition using one or more techniques resulting in relatively fast storage of the data information. For example, such data information may be written into a memory partition using a single programming pulse comprising a reset pulse having a given amplitude, or a set pulse having relatively short pulse width, for example. On the other hand, if such a comparison fails to result in a match, then process 500 may proceed to block 543 where the memory device may generate program error signals to be transmitted to a memory controller and/or host processor, for example. Of course, such a process for writing information into a memory device is merely an example, and claimed subject matter is not so limited.

Figure 6:
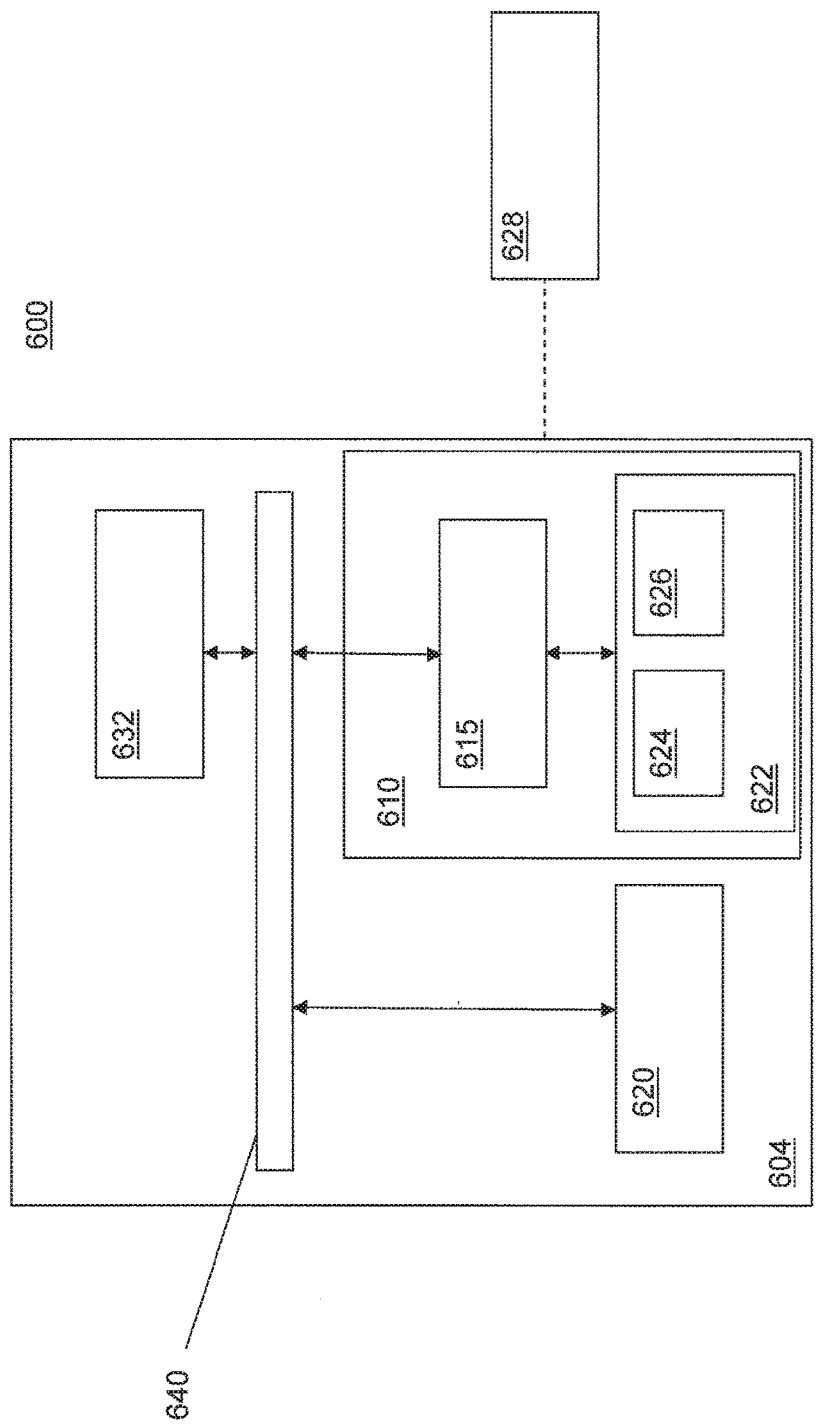
FIG. 6 is a schematic view of a computing system and a memory device, according to an embodiment.

FIG. 6 is a schematic diagram illustrating an exemplary embodiment of a computing system 600 including a memory device 610. Such a computing device may comprise one or more processors, for example, to execute an application and/or other code. For example, memory device 610 may comprise a PCM array having a memory space 150, shown in FIG. 1. A computing device 604 may be representative of any device, appliance, or machine that may be configurable to manage memory device 610. Memory device 610 may include a memory controller 615 and a memory 622. By way of example but not limitation, computing device 604 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 600, and the processes and methods as further described herein, may be implemented using or otherwise including hardware, firmware, software, or any combination thereof. Thus, by way of example but not limitation, computing device 604 may include at least one processing unit 620 that is operatively coupled to memory 622 through a bus 640 and a host or memory controller 615. Processing unit 620 is representative of one or more circuits configurable to perform at least a portion of a data computing procedure or process. By way of example but not limitation, processing unit 620 may include one or more processors, controllers, microprocessors, microcontrollers, application specific integrated circuits, digital signal processors, programmable logic devices, field programmable gate arrays, and the like, or any combination thereof. Processing unit 620 may include an operating system configured to communicate with memory controller 615. Such an operating system may, for example, generate commands to be sent to memory controller 615 over bus 640. Such commands may comprise read and/or write commands. In response to a write command, for example, memory controller 615 may provide a bias signal, such as a set or reset pulse to write information associated with the write command to a memory partition, for example.

Memory 622 is representative of any data storage mechanism. Memory 622 may include, for example, a primary memory 624 and/or a secondary memory 626, each of which may be partitioned into one or more partitions as discussed above, for example. Memory 622 may comprise PCM, for example. Primary memory 624 may include, for example, a random access memory, read only memory, etc. While illustrated in this example as being separate from processing unit 620, it should be understood that all or part of primary memory 624 may be provided within or otherwise co-located/coupled with processing unit 620.

Secondary memory 626 may include, for example, the same or similar type of memory as primary memory and/or one or more data storage devices or systems, such as, for example, a disk drive, an optical disc drive, a tape drive, a solid state memory drive, etc. In certain implementations, secondary memory 626 may be operatively receptive of, or otherwise configurable to couple to, a computer-readable medium 628. Computer-readable medium 628 may include, for example, any medium that can carry and/or make accessible data, code, and/or instructions for one or more of the devices in system 600.

Computing device 604 may include, for example, an input/output 632. Input/output 632 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 632 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method, comprising:
    identifying a type of information associated with a first write command;

selecting, based at least in part on the type of the information, a first write circuit for executing the first write command; and programming, by executing the first write command, the information to a first portion of a memory using the first write circuit.

2. The method of claim 1, further comprising:

executing the first write command using the first write circuit based at least in part on selecting the first write circuit.

3. The method of claim 2, wherein executing the first write command comprises applying a plurality of programming pulses.

4. The method of claim 2, wherein executing the first write command comprises executing a verify process using the first write circuit.

5. The method of claim 4, further comprising:

generating a program error pulse based at least in part on executing the verify process.

6. The method of claim 1, further comprising:

identifying a second type of second information associated with a second write command;

selecting, based at least in part on the second type of the second information, a second write circuit for executing the second write command; and executing the second write command using the second write circuit based at least in part on selecting the second write circuit.

7. The method of claim 6, wherein executing the second write command comprises applying a programming pulse.

8. The method of claim 6, wherein the second type of the second information comprises an operating system data or program data.

9. The method of claim 1, wherein the type of the information comprises an operating system code or program code.

10. A memory device, comprising:

a memory array; and a memory controller configured to:

identify a type of information associated with a first write command;

select, based at least in part on the type of the information, a first write circuit for performing the first write command; and program, by executing the first write command, the information to a first portion of a memory using the first write circuit.

11. The memory device of claim 10, wherein the memory controller is configured to:

execute the first write command using the first write circuit based at least in part on selecting the first write circuit; and execute a verify process using the first write circuit based at least in part on executing the first write command.

12. The memory device of claim 11, wherein the memory controller is configured to:

generate a program error pulse based at least in part on executing the first write command.

13. The memory device of claim 11, wherein executing the first write command comprises applying a programming pulse using the first write circuit.

14. The memory device of claim 10, wherein the memory controller is configured to:

identify a second type of second information associated with a second write command;

select, based at least in part on the second type of the second information, a second write circuit for performing the second write command; and execute the second write command using the second write circuit based at least in part on selecting the second write circuit.

15. The memory device of claim 14, wherein executing the second write command comprises applying one programming pulse using the second write circuit.

16. A system, comprising:

a memory array;

a processor configured to initiate a first write command for programming information to a first portion of the memory array; and a memory controller configured to:

identify a type of information associated with the first write command;

select, based at least in part on the type of the information, a first write circuit for performing the first assess write command; and program, by executing the first write command, the information to the first portion of the memory array using the first write circuit.

17. The system of claim 16, wherein the memory controller is configured to:

identify a second type of second information associated with a second write command;

select, based at least in part on the second type of the second information, a second write circuit for performing the second write command; and execute the second write command using the second write circuit based at least in part on selecting the second write circuit.

* * * * *